United States Patent
Chen et al.

(10) Patent No.: US 10,707,771 B1
(45) Date of Patent: Jul. 7, 2020

(54) INTEGRATED MECHANICAL AND THERMAL DESIGN FOR POWER STORAGE OF A TRACTION INVERTER

(71) Applicant: Ford Global Technologies, LLC, Dearborn, MI (US)

(72) Inventors: Lihua Chen, Farmington Hills, MI (US); Fan Wang, Novi, MI (US); Fan Xu, Novi, MI (US); Boris Curuvija, Dearborn Heights, MI (US); Baoming Ge, Okemos, MI (US); Shahram Zarei, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/270,270

(22) Filed: Feb. 7, 2019

(51) Int. Cl.
  *H02M 7/00* (2006.01)
  *H05K 7/20* (2006.01)
  *H05K 5/02* (2006.01)

(52) U.S. Cl.
  CPC .......... *H02M 7/003* (2013.01); *H05K 5/0217* (2013.01); *H05K 7/2089* (2013.01); *H05K 7/20509* (2013.01); *H05K 7/20845* (2013.01)

(58) Field of Classification Search
  CPC combination set(s) only.
  See application file for complete search history.

(56) References Cited

U.S. PATENT DOCUMENTS

| | | | |
|---|---|---|---|
| 6,393,853 B1* | 5/2002 | Vukovic | H01L 23/473 165/80.4 |
| 6,940,735 B2* | 9/2005 | Deng | H02M 5/4585 290/46 |
| 7,508,289 B1* | 3/2009 | Wernicki | H01F 27/10 336/55 |
| 10,236,791 B1* | 3/2019 | Chung | H02M 7/53871 |
| 10,447,170 B1* | 10/2019 | Wu | H02M 7/537 |
| 2005/0105306 A1* | 5/2005 | Deng | H02M 5/4585 363/37 |
| 2006/0152085 A1* | 7/2006 | Flett | B60L 9/30 307/75 |
| 2007/0258219 A1* | 11/2007 | Howes | H05K 7/1432 361/728 |
| 2009/0139781 A1 | 6/2009 | Straubel | |
| 2010/0266875 A1* | 10/2010 | Somogye | G05F 1/10 429/7 |
| 2014/0338375 A1 | 11/2014 | Carpenter et al. | |
| 2019/0280611 A1* | 9/2019 | Chung | H01L 25/072 |
| 2019/0296658 A1* | 9/2019 | Chung | H05K 7/1432 |
| 2019/0335628 A1* | 10/2019 | Lei | H05K 7/20927 |

\* cited by examiner

*Primary Examiner* — Binh B Tran
*Assistant Examiner* — Krystal Robinson
(74) *Attorney, Agent, or Firm* — David B. Kelley; Brooks Kushman P.C.

(57) ABSTRACT

A traction inverter system includes a capacitor module, a power module, a cold plate between and in contact with the modules, and an end plate defining an inlet and outlet. The modules and plates define a bore spanning the modules and plates, and a passageway in fluid communication with the inlet and outlet. The traction inverter system also includes a mechanical fastener occupying the bore, spanning the modules and plates, and clamping the modules and plates together.

16 Claims, 4 Drawing Sheets

INTEGRATED MECHANICAL AND THERMAL DESIGN FOR POWER STORAGE OF A TRACTION INVERTER

TECHNICAL FIELD

This disclosure relates to automotive traction drive inverter systems.

BACKGROUND

Electric vehicles (EVs), hybrid electric vehicles (HEVs), and plug-in hybrid electric vehicles (PHEVs) are continuing to be developed. Powertrains of these vehicles may include traction drive inverter systems. To improve efficiency, certain traction drive inverter systems are becoming smaller and lighter. This continued drive to reduce required packaging space and weight, however, has introduced challenges related to mechanical integration of and cooling design for traction inverter componentry such as DC-link capacitors, power inductors, and power modules.

SUMMARY

A traction inverter system includes a capacitor module, a power module, a cold plate between and in contact with the modules, and an end plate defining an inlet and outlet. The modules and plates define a bore spanning the modules and plates. The modules and plates also define a passageway in fluid communication with the inlet and outlet. The traction inverter system also includes a mechanical fastener occupying the bore, spanning the modules and plates, and clamping the modules and plates together.

An automotive power system includes a capacitor module, a power module, a power inductor, an end plate defining an inlet and outlet, and a pair of cold plates stacked and mechanically fastened together such that the cold plates are separated by the capacitor module, power module, or power inductor to form a traction inverter arrangement, wherein the end plate, cold plates, and the capacitor module, power module, or power inductor collectively define a passageway in fluid communication with the inlet and outlet.

A traction inverter system includes a capacitor module, a power module, an end plate defining an inlet and outlet, and a cold plate stacked to form a single unit. The capacitor module, power module, end plate, and cold plate define a passageway in fluid communication with the inlet and outlet. The traction inverter system also includes a mechanical fastener passing through each of the capacitor module, power module, end plate, and cold plate. The mechanical fastener clamps the single unit together.

DETAILED DESCRIPTION

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present technology.

As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

Figure 1:
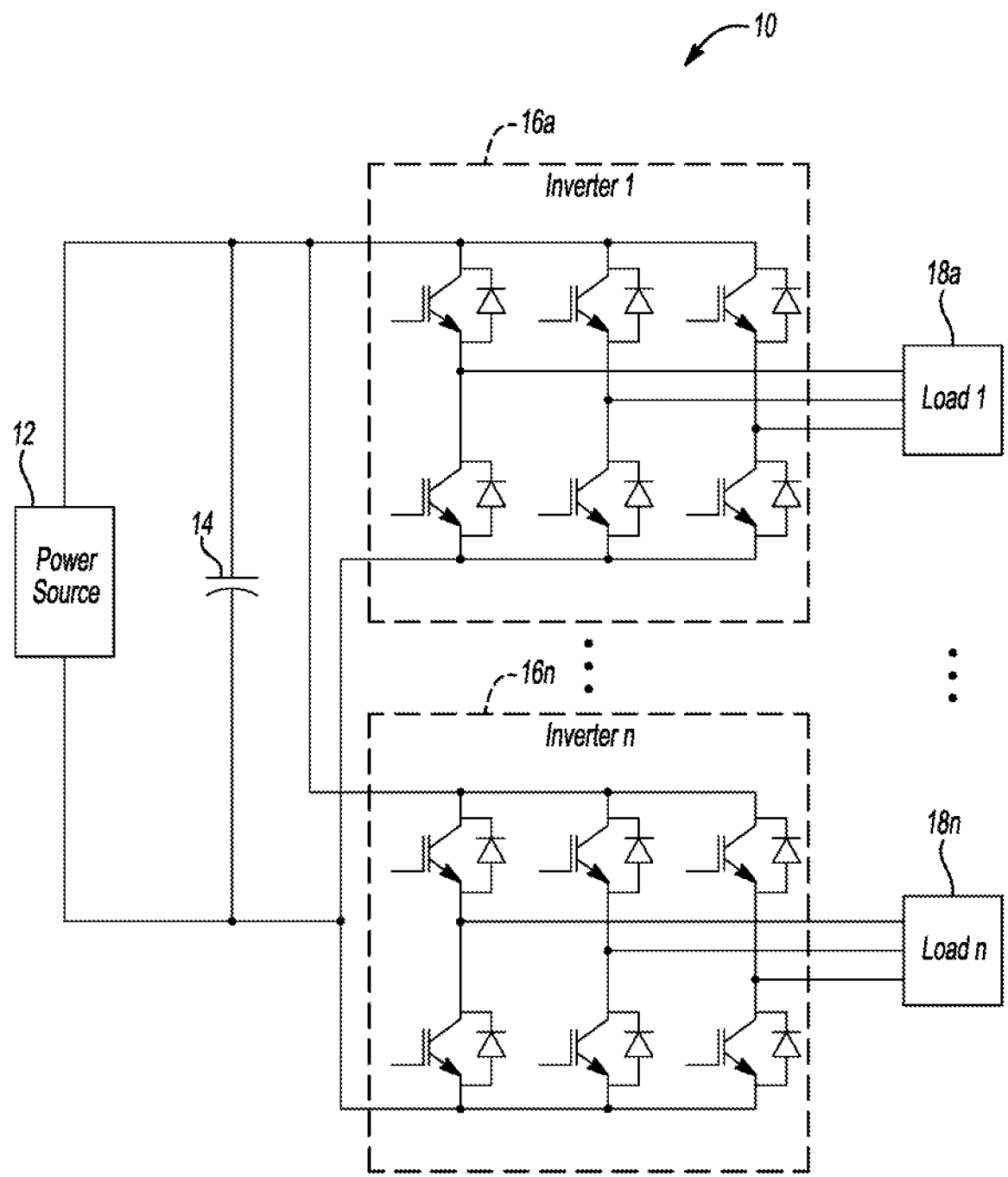
FIG. 1 is a schematic diagram of portions of a vehicle power system.

Referring to FIG. 1, a conventional automotive power system 10 includes a power source 12, such as a traction battery, a DC-link capacitor 14, a plurality of inverters 16*a*-16*n*, and a plurality of loads 18*a*-18*n* corresponding to the inverters 16*a*-16*n*. The DC-link capacitor 14 is electrically connected between the power source 12 and inverters 16*a*-16*n*. That is here, the inverters 16*a*-16*n* "share" the DC-link capacitor 14. The DC-link capacitor 14 may function to absorb ripple current generated by the power source 12 or the inverters 16*a*-16*n*, and stabilize the DC-link voltage for inverter control.

A film capacitor or other type of capacitor can be used for the DC-link capacitor application described above. Worst case driving conditions could subject the DC-link capacitor to high ripple current. This raises the possibility of heating the capacitor. Capacitor heat loss is generated by dielectric material self-heating due to the ripple current, or by electrode system Ohmic loss. Advances have improved the ability to pack more capacitance in a smaller volume for a given voltage rating. This results in higher heat loss density and may raise further issues with capacitor thermal performance.

Figure 2:
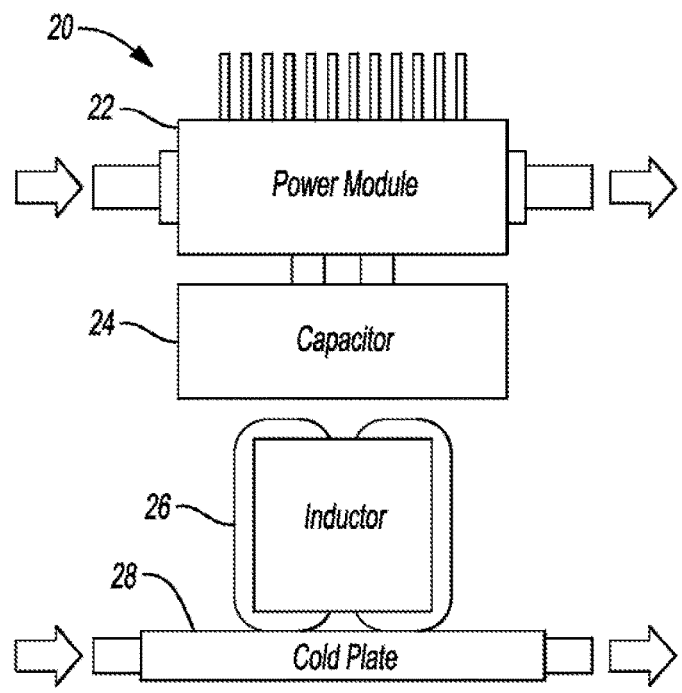
FIG. 2 is a schematic diagram of a power module-capacitor-inductor arrangement and corresponding cooling system.

Referring to FIG. 2, a conventional traction drive inverter 20 includes a power module 22, a DC-link capacitor 24, an inductor 26, and a cold plate 28. In certain arrangements, the DC-link capacitor 24 needs to be placed as close as possible to the inverter power semiconductor switches 22 (power module) to minimize parasitic inductance. For conventional inverter designs, the capacitor 24 and power module 22 are electrically connected via a DC busbar. The housings of these modules physically separate them. As such, heat is dissipated mainly through convection for conventional capacitor designs.

The size and shape of a capacitor may have significant impact on its ability to dissipate heat. To achieve thermal objectives, an exaggerated capacitor can be selected to increase outer surface area. The thermal conductivity of capacitor packaging, however, is low (e.g. less than 1 w/k-m), which means it may be difficult for a capacitor to dissipate the heat from cell core to outer skin via conduction. Moreover, conventional designs may lead to oversizing and low cooling effectiveness concerns recognizing that the thermal path could become even longer with increasing capacitor size. Here, integrated mechanical and cooling designs of power stages for inverters are proposed to address the various concerns discussed above.

For a single inverter, a power module and capacitor module may be stacked together side by side along the longitudinal direction, and share a liquid cooled cold plate placed in the middle. Screwing or other types of fastening methods could be used for power module and capacitor clamping, which ensures the power module, cold plate, and capacitor module tightly contact each other to reduce thermal resistance at the interfaces. Thermal grease or thermal interface material (TIM) can be applied to eliminate air gaps at contact surfaces and further reduce thermal resistance.

For single-sided cooling for a capacitor and double-sided cooling for a power module, cold plates may be looped together through cooling channels. They may be tied in to the power module cooler inlet and outlet to form an integrated cooling system.

For dual inverter applications (including a variable voltage converter or boost converter), the integrated mechanical and thermal design can be extended to integrate the power module, power inductor, and capacitor module as a unit of power stage. The capacitor module itself can be a DC-link capacitor only, or an integrated module of the DC-link capacitor, input capacitor, and Wye capacitor.

The relative positions of the power module, power inductor, and capacitor module is adjustable depending on specific design requirements. As an example, if only inductor thermal performance is a concern, the inductor may be placed between the power module and capacitor, with double-sided cooling for the inductor, and single-sided cooling for the capacitor and power module. For other examples, the positions of the capacitor and power inductor are exchanged to locate the capacitor closer to the power module. Three cold plates may be used for double-sided cooling of the power inductor and capacitor. Four cold plates may be used for double-sided cooling of the power module, power inductor, and capacitor, etc.

Figure 3:
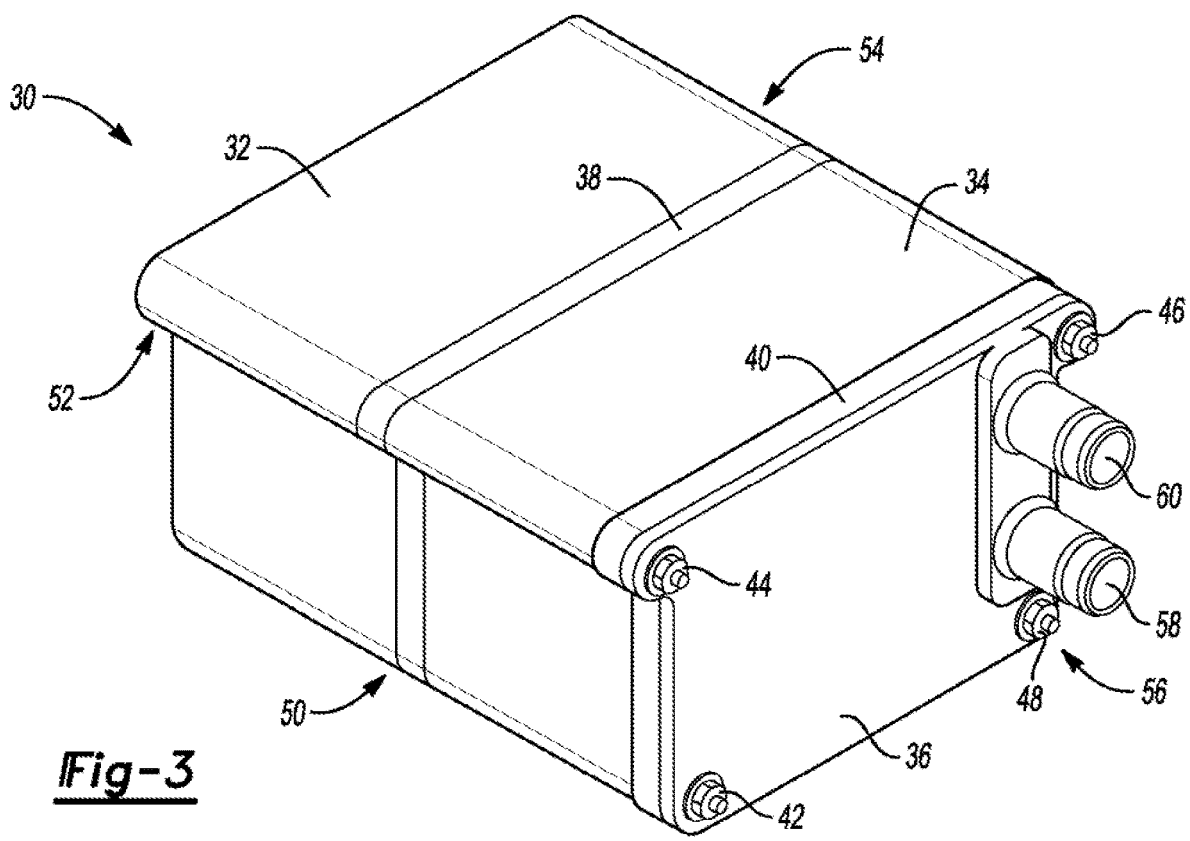
FIG. 3 is a perspective view of a single inverter with an integrated fastening and double cold plate cooling system.

Referring to FIG. 3, an integrated capacitor and power module mechanical and thermal design for a traction inverter system 30 is shown. The traction inverter system 30 includes a capacitor module 32, a power module 34, an end plate 36, cold plates 38, 40, and mechanical fasteners 42, 44, 46, 48. The cold plate 38 is between and in contact with the capacitor module 32 and power module 34. The cold plate 40 is between and in contact with the power module 34 and end plate 36. In the example of FIG. 3, the power module 34 is between the capacitor module 32 and end plate 36. In other examples, the capacitor module 32 may be between the power module 34 and end plate 36, etc.

At respective corners 50, 52, 54, 56 of the traction inverter system 30, each of the capacitor module 32, power module 34, end plate 36, and cold plates 38, 40, defines a portion of a bore along an entire length of the traction inverter system 30. When these components are stacked together as shown, the portions align such that a passageway is formed that spans between outer ends of the traction inverter system 30 defined by the capacitor module 32 and end plate 36.

The mechanical fastener 42 occupies the bore at the corner 50. The mechanical fastener 44 occupies the bore at the corner 52. The mechanical fastener 46 occupies the bore at the corner 54. And, the mechanical fastener 48 occupies the bore at the corner 56. In this example, the mechanical fasteners 42, 44, 46, 48 include threaded bolts and corresponding nuts and washers. Other mechanical fasteners, however, may be used. Each of the threaded bolts occupies one of the bores and extends beyond the outer ends of the traction inverter system 30. Corresponding washers and nuts are engaged with opposite ends of the threaded fasteners to clamp the capacitor module 32, power module 34, end plate 36, and cold plates 38, 40 together, and may be further epoxied or tac welded in place.

The end plate 36 defines fluid inlet and outlet ports 58, 60. Fluid inlet and outlet ports, however, may be on opposite sides in other configurations. That is, one endplate may define an inlet port and another end plate may defined an outlet port, etc. As discussed in further detail below, such ports are in fluid communication with cooling passageways defined in the power module 34 and cold plates 38, 40.

Figure 4:
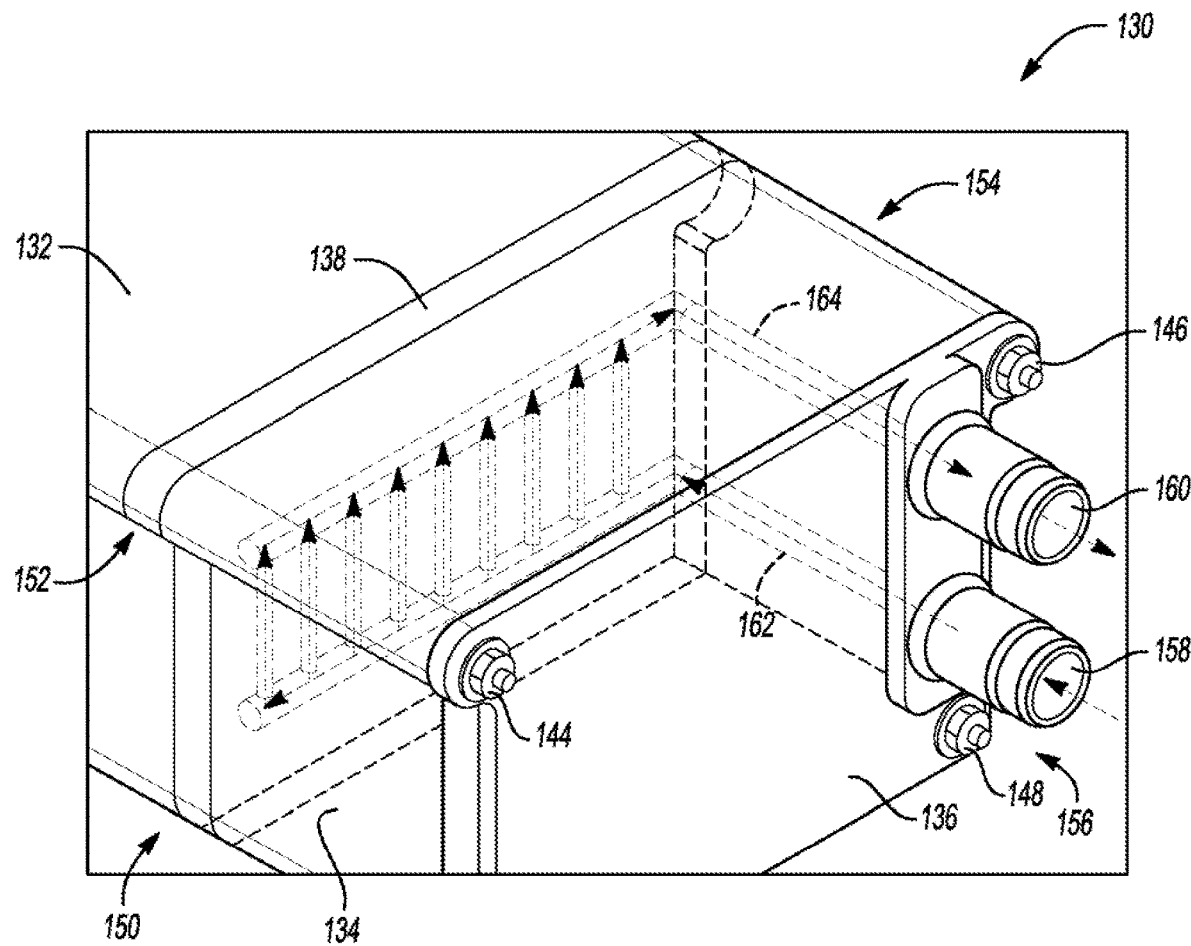
FIG. 4 is a perspective view of another single inverter with an integrated fastening and single cold plate cooling system.

Referring to FIG. 4, a traction inverter system 130 includes a capacitor module 132, a power module 134, an end plate 136, a cold plate 138, and mechanical fasteners 142, 144, 146, 148. And the end plate 136 defines inlet and outlet ports 158, 160. The cold plate 138 is between and in contact with the capacitor module 132 and power module 134. Unlike the traction inverter system 30 of FIG. 3, the traction inverter system 130 does not include a cold plate between the power module 134 and end plate 136.

The power module 134 is shown in hidden line to reveal an inlet passageway 162 and outlet passageway 164 formed within a housing of the power module 134. The inlet passageway 162 corresponds with the inlet port 158 and the outlet passageway 164 corresponds with the output port 160. Fluid from the inlet port 158 travels through the power module 134 via the inlet passageway 162 and is delivered to the cold plate 138, and fluid from the cold plate 138 travels through the power module 134 via the outlet passageway 164 and is delivered to the outlet port 160. Coolant can thus be delivered to the cold plate 138, which is in contact with and therefore cools both the capacitor module 132 and power module 134.

Figure 5:
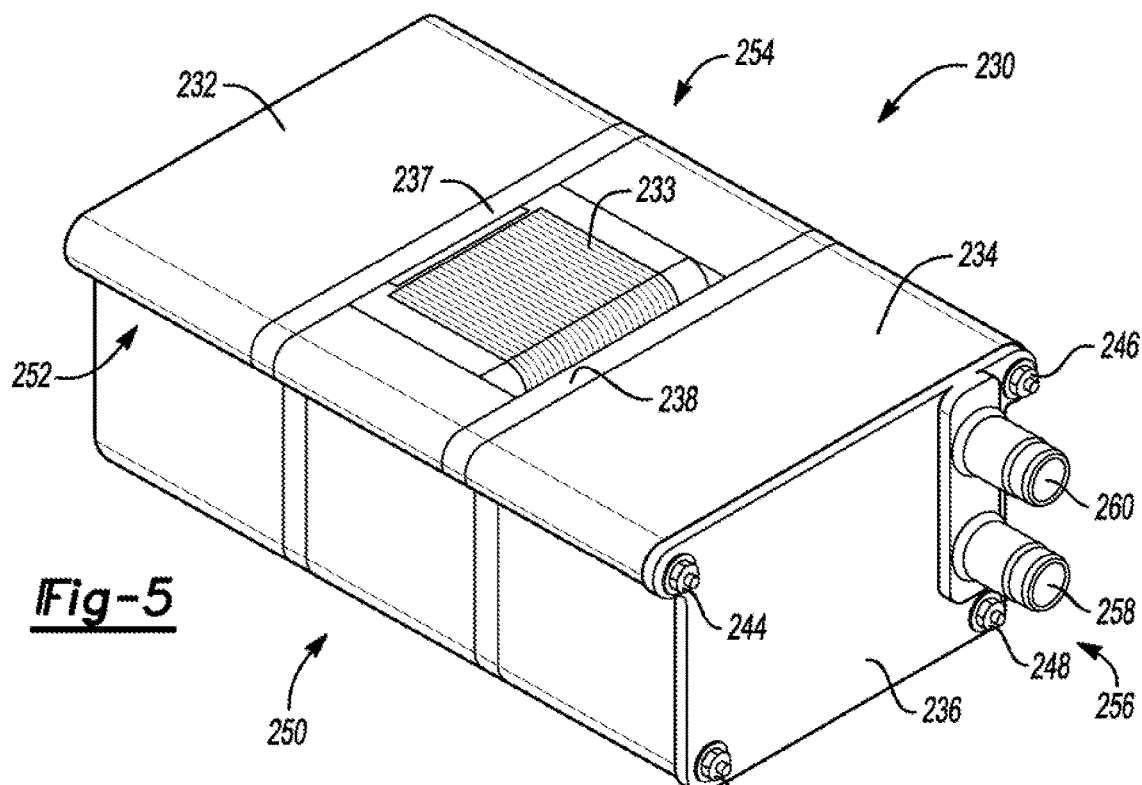
FIG. 5 is a perspective view of a dual inverter with an integrated fastening and double cold plate cooling system.

Referring to FIG. 5, a traction inverter system 230 includes a capacitor module 232, a power inductor 233, a power module 234, an end plate 236, cold plates 237, 238, and mechanical fasteners 242, 244, 246, 248. And the end plate 236 defines fluid inlet and outlet ports 258, 260. The cold plate 237 is between and in contact with the capacitor module 232 and power inductor 233. The cold plate 238 is between and in contact with the power inductor 233 and power module 234. As suggested above, the mechanical fasteners 242, 244, 246, 248 clamp the capacitor module 232, power inductor 233, power module 234, end plate 236, and cold plates 237, 238 together. Moreover, the capacitor module 232, power inductor 233, power module 234, end plate 236, and cold plates 237, 238 define a passageway in fluid communication with internal passages of the cold plates 237, 238 and inlet and outlet ports 258, 260 to provide access to the cold plates 237, 238 for cooling purposes.

Figure 6:
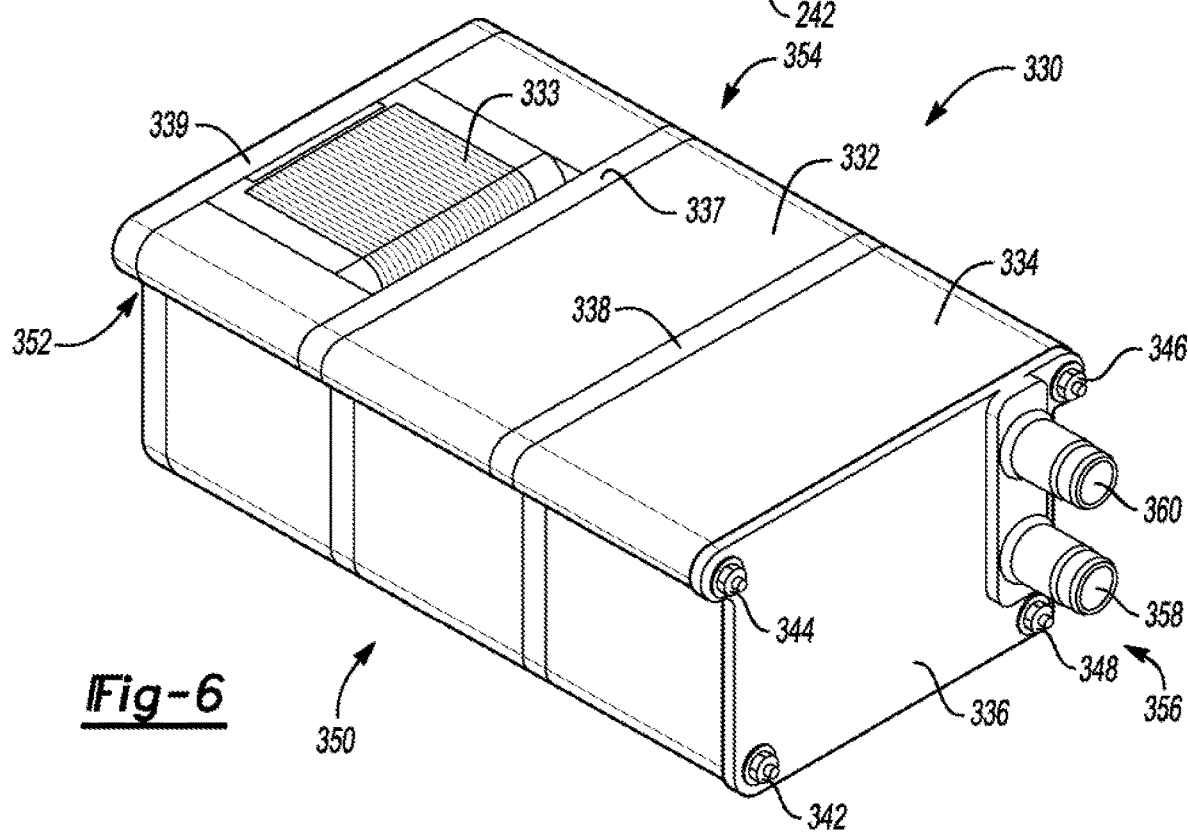
FIG. 6 is a perspective view of a dual inverter with an integrated fastening and triple cold plate cooling system.

Referring to FIG. 6, a traction inverter system 330 includes a capacitor module 332, a power inductor 333, a power module 334, an end plate 336, cold plates 337, 338, 339, and mechanical fasteners 342, 344, 346, 348. And the end plate 336 defines fluid inlet and outlet ports 358, 360. The cold plate 337 is between and in contact with the capacitor module 332 and power inductor 333. The cold plate 338 is between and in contact with the capacitor module 332 and power module 334. The cold plate 339 is in contact with the power inductor 333. As suggested above, the mechanical fasteners 342, 344, 346, 348 clamp the capacitor module 332, power inductor 333, power module 334, end plate 336, and cold plates 337, 338, 339 together. Moreover, the capacitor module 332, power inductor 333, power module 334, end plate 336, and cold plates 337, 338, 339 define a passageway in fluid communication with internal passages of the cold plates 337, 338, 339 and inlet and outlet ports 358, 360 to provide access to the cold plates 337, 338, 339 for cooling purposes.

As apparent to those of ordinary skill, the integrated clamping and cooling designs contemplated herein may be compact and flexible, making it easier to downsize and optimize traction inverter layout. These designs may also improve capacitor, power module, and power inductor thermal performance. Additionally, these designs may allow for the various components to share a common footprint, potentially simplifying manufacturing and assembly processes.

When viewed in a direction normal to the exposed surface of the end plate 336, the capacitor module 332, power inductor 333, power module 334, end plate 336, and cold plates 337, 338, 339 each have a common outline or perimeter shape. Moreover, the capacitor module 332, power inductor 333, and power module 334 each have a common length, width, and depth. Such commonalities may reduce costs associated with part handling, transportation, storage, assembly, etc. as common tools can be used to work with each.

The words used in the specification are words of description rather than limitation, and it is understood that various changes may be made without departing from the spirit and scope of the disclosure and claims. As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A traction inverter system comprising:
   a capacitor module;
   a power module;
   a cold plate between and in contact with the modules;
   a power inductor adjacent to at least one of the modules;
   an end plate defining an inlet and outlet, wherein the modules and plates define (i) a bore spanning the modules and plates and (ii) a passageway in fluid communication with the inlet and outlet; and
   a mechanical fastener occupying the bore, spanning the modules and plates, and clamping the modules and plates together.

2. The traction inverter system of claim 1 further comprising another cold plate between and in contact with the power module and end plate, and in fluid communication with the passageway.

3. The traction inverter system of claim 1 further comprising another cold plate in contact with the capacitor module but not the power module, and in fluid communication with the passageway.

4. The traction inverter system of claim 1 further comprising another cold plate in contact with the power inductor and in fluid communication with the passageway.

5. The traction inverter system of claim 1, wherein the bore is defined on a corner of each of the modules and plates.

6. The traction inverter system of claim 1, wherein the mechanical fastener includes a bolt and nut.

7. An automotive power system comprising:
   a capacitor module, a power module, a power inductor, an end plate defining and inlet and outlet, and a pair of cold plates stacked and mechanically fastened together such that the cold plates are separated by the capacitor module, power module, or power inductor to form a traction inverter arrangement, wherein the (i) end plate, (ii) cold plates, and (iii) capacitor module, power module, or power inductor collectively define a passageway in fluid communication with the inlet and outlet, wherein the power inductor is between the capacitor module and power module.

8. The automotive power system of claim 7, wherein the capacitor module is between the power inductor and the power module.

9. The automotive power system of claim 7, wherein the power module is in contact with the end plate.

10. The automotive power system of claim 7 further comprising a third cold plate stacked and mechanically fastened with the capacitor module, power module, power inductor, end plate, and pair of cold plates, and in fluid communication with the passageway.

11. The automotive power system of claim 7 further comprising thermal interface material on surfaces of the cold plates.

12. A traction inverter system comprising:
    a capacitor module, a power module, an end plate defining an inlet, and a cold plate stacked to form a single unit, wherein the capacitor module, power module, end plate, and cold plate define a passageway in fluid communication with the inlet;
    a mechanical fastener passing through each of the capacitor module, power module, end plate, and cold plate, and configured to clamp the single unit together; an
    a power inductor stacked with the single unit.

13. The traction inverter system of claim 12, wherein the cold plate is between the power module and end plate.

14. The traction inverter system of claim 12, wherein the cold plate is between the capacitor module and power module.

15. The traction inverter system of claim 12 further comprising another cold plate stacked with the single unit and in fluid communication with the passageway.

16. The traction inverter system of claim 12, wherein the mechanical fastener passes through the power inductor.

* * * * *